(12) United States Patent
Li et al.

(10) Patent No.: US 6,890,875 B2
(45) Date of Patent: May 10, 2005

(54) TUNABLE DEVICES INCORPORATING BICU₃TI₃FEO₁₂

(75) Inventors: Dong Li, Newark, DE (US); Manirpallam Appadorai Subramanian, Kennett Square, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 122 days.

(21) Appl. No.: 10/258,255

(22) PCT Filed: May 3, 2001

(86) PCT No.: PCT/US01/14296
§ 371 (c)(1),
(2), (4) Date: Oct. 21, 2002

(87) PCT Pub. No.: WO01/84561
PCT Pub. Date: Nov. 8, 2001

(65) Prior Publication Data
US 2004/0119055 A1 Jun. 24, 2004

Related U.S. Application Data

(60) Provisional application No. 60/201,809, filed on May 4, 2000.

(51) Int. Cl.⁷ ............ C04B 35/26; C04B 35/475; G11C 11/22
(52) U.S. Cl. ............ 501/134; 423/594; 423/598; 365/145
(58) Field of Search ............ 252/520.21, 521.2; 501/134, 136; 423/594, 598; 365/145

(56) References Cited

U.S. PATENT DOCUMENTS 5,472,935 A    12/1995   Yandrofski et al.

OTHER PUBLICATIONS

Subramanian et al "High Dielectric Constant in ACu3Ti4O12 and Acu3Ti3FeO12 Phases", Journal of Solid State Chemistry, 151(2), 323–325 May 2, 2000.*

* cited by examiner

Primary Examiner—Mark Kopec

(57) ABSTRACT

This invention provides the novel dielectric $BiCu_3Ti_3FeO_{12}$. $BiCu_3Ti_3FeO_{12}$ provides good dielectric tunability and low loss over a frequency range of from 10 kHz to 10 MHz and is especially useful in tunable devices such as phase shifters, matching networks, oscillators, filters, resonators, and antennas comprising interdigital and trilayer capacitors, coplanar waveguides and microstrips.

2 Claims, No Drawings

TUNABLE DEVICES INCORPORATING BICU₃TI₃FEO₁₂

This application claims the benefit of U.S. Provisional Application No. 60/201,809, filed on May 4, 2000.

FIELD OF THE INVENTION

The present invention provides tunable devices incorporating the dielectric $BiCu_3Ti_3FeO_{12}$.

FIELD OF THE INVENTION

The use of dielectric materials to increase capacitance is well known and long-used. Earlier capacitor dielectrics fell into two categories. The first category of dielectrics has a relatively temperature-independent dielectric constant but the value of the dielectric constant is low, e.g., 5–10. Materials such as electrical porcelain and mica fall in this category. The second category of dielectrics has very high dielectric constant, e.g., 1000 or more, but they are quite temperature dependent. An example is barium titanate, $BaTiO_3$.

Since the capacitance is proportional to the dielectric constant, high dielectric constant materials are desired. In order to perform acceptably in tuning or resonance circuits the dielectric must have a dielectric constant that exhibits minimal temperature dependence; otherwise small changes in ambient temperature throw the circuit out of resonance. Other applications require a dielectric constant that exhibits minimal frequency dependence. It is also desirable to have the loss or dissipation factor as small as possible.

For many microwave devices the important material features are the dielectric tunability, i.e., the change in dielectric constant with applied voltage, and low dielectric loss. Barium strontium titanate, $Ba_{1-x}Sr_xTiO_3$, has been used in some such applications but the need persists for materials with better properties.

Yandrofski et al., U.S. Pat. No. 5,472,935, disclose tunable microwave and millimeter wave devices incorporating tunable ferroelectrics.

SUMMARY OF THE INVENTION

This invention provides the novel dielectric $BiCu_3Ti_3FeO_{12}$. $BiCu_3Ti_3FeO_{12}$ provides good dielectric tunability and low loss over a frequency range of from 10 kHz to 10 MHz and is especially useful in tunable devices such as phase shifters, matching networks, oscillators, filters, resonators, and antennas comprising interdigital and trilayer capacitors, coplanar waveguides and microstrips.

DETAILED DESCRIPTION OF THE INVENTION $BiCu_3Ti_3FeO_{12}$ has dielectric properties that provide advantages in devices requiring a high dielectric constant as well as in tunable devices.

$BiCu_3Ti_3FeO_{12}$ can be synthesized by the following procedure. Stoichiometric amounts of the precursors are thoroughly mixed. The precursors $Bi_2O_3$, CuO, $TiO_2$ and $Fe_2O_3$ are preferred. The mixed precursor powder is calcined at about 900° C. for about 12 hours. The calcined powder is reground and pressed to 12.7 mm diameter/1–2 mm thick disks. The disks are sintered in air at about 975° C. for 24 hours. In both the calcining and sintering steps, the temperature ramping up rate is about 200° C./hour from room temperature, i.e., about 20° C., to the calcining or sintering temperature and the cooling rate is about 150° C./hour from the calcining or sintering temperature to room temperature, i.e., about 20° C.

$BiCu_3Ti_3FeO_{12}$ crystallizes in a cubic perovskite Im3 structure.

Dielectric measurements were carried out on the disk samples. The faces of the disk-shaped samples were polished with a fine-grit sand or emery paper. Silver paint electrodes were applied on the faces and dried at 70–100° C. The capacitance and the dielectric loss measurements were performed by the two-terminal method using Hewlett-Packard 4275A and 4284A LCR bridges at a temperature of 25° C. over a frequency range of from 1 kHz to 1 MHz. The capacitance, C, and the dissipation factor are read directly from the bridge. The dielectric constant (K) was calculated from the measured capacitance, C in picofarads, from the relationship, K=(100 C t)/(8.854 A), where t is thickness of the disk shaped sample in cm and A is the area of the electrode in $cm^2$. Voltages were applied across the flat electroded faces of the disks and tunability was calculated by measuring the change in dielectric constant with applied voltage. The tunability, T, is calculated from the equation T=[K(0)−K(V)]/K(0)] where K(0) is the dielectric constant when there is no applied voltage and K(V) is the dielectric constant when there is an applied voltage V. The tunability is usually expressed as a percent for a given applied electric field so that the above result for T is multiplied by 100 or it is written as T=(constant) E where T is the tunability in %, E is the electric field and the constant is characteristic of the particular material.

EXAMPLES OF THE INVENTION $BiCu_3Ti_3FeO_{12}$ was prepared by the following procedure. Appropriate amounts of the starting oxides $Bi_2O_3$, CuO, $TiO_2$ and $Fe_2O_3$ were weighed according to the stoichiometric ratios and mixed thoroughly in an agate mortar. The gram amounts of the precursors used are shown in Table 1. The mixed powder was calcined at 900° C. for 12 hours. The calcined powder was reground and pressed to 12.7 mm diameter/1–2 mm thick disks. The disks were sintered in air at 975° C. for 24 hours. In both the calcining and sintering steps, the temperature was increased from room temperature, i.e., about 20° C., to the calcining or sintering temperature at a rate of 200° C./hour and the temperature was decreased from the calcining or sintering temperature to room temperature, i.e., about 20° C., at a rate of 150° C./hour.

X-ray powder diffraction patterns were recorded with a Siemens D5000 diffractometer. The data showed that $BiCu_3Ti_3FeO_{12}$ crystallized in a cubic perovskite related Im3 structure. The measured lattice parameter is listed in Table 1.

TABLE 1

| | |
|---|---|
| CuO | 0.4826 g |
| $TiO_2$ | 0.4846 g |
| $Bi_2O_3$ | 0.4712 g |
| $Fe_2O_3$ | 0.1614 g |
| a, measured lattice parameter | 0.7445(3) |

The disk samples were polished to produce flat uniform surfaces and electroded with silver paint. The painted samples were dried at 70–100° C. overnight. Capacitance and loss tangent measurements were taken on a HP-4284A LCR meter at room temperature, i.e., about 20° C., over a frequency range of from 1 kHz to 1 MHz. The results are shown in Table 2.

TABLE 2

| Frequency (Hz) | Dielectric Constant | Loss Tangent |
| --- | --- | --- |
| 1k | 1160 | 0.9287 |
| 10k | 785.8 | 0.247 |
| 100k | 692.3 | 0.0821 |
| 1M | 644.3 | 0.0508 |

Voltages up to 100V were applied across the flat electroded faces of the disks using an Keithley 228A voltage/current source and the dielectric constant was measured as a function of applied voltage at room temperature using a HP-4275A LCR meter. The percent tunability and the applied electric filed to obtain that magnitude tunability are shown in Table 3 over a frequency range of from 10 kHz to 10 MHz. The tunability equation written in the form T=(constant) E is also given in Table 3. This equation is valid over the whole frequency range.

TABLE 3

| Electric Field (V/$\mu$m) | Frequency (Hz) | | | |
| --- | --- | --- | --- | --- |
| | 10k | 100k | 1M | 10M |
| 0 | 0.000 | 0.000 | 0.000 | 0.000 |
| 0.0134 | 0.207 | 0.219 | 0.158 | 0.203 |
| 0.0279 | 0.338 | 0.322 | 0.317 | 0.340 |
| 0.0419 | 0.443 | 0.469 | 0.426 | 0.488 |
| 0.0559 | 0.517 | 0.624 | 0.579 | 0.639 |
| 0.0698 | 0.582 | 0.727 | 0.765 | 0.776 |
| Tunability (fitting equation) | $T = 10.2 \times E$ | | | |
| | (T: tunability in %, E: electric field in V/$\mu$m) | | | |

The results show that $BiCu_3Ti_3FeO_{12}$ has a relatively high tunability which is frequency independent from 10 kHz to 10 MHz.

What is claimed is:

1. A ferroelectric composition of the formula $BiCu_3Ti_3FeO_{12}$.

2. A tunable electric device comprising $BiCu_3Ti_3FeO_{12}$.

* * * * *

UNITED STATES PATENT AND TRADEMARK OFFICE
CERTIFICATE OF CORRECTION

PATENT NO. : 6,890,875 B2
DATED : May 10, 2005
INVENTOR(S) : Li et al.

It is certified that error appears in the above-identified patent and that said Letters Patent is hereby corrected as shown below:

Title page,
Item [75], Inventors, please delete "Manirpallam" and insert -- Munirpallam -- therefor.

Signed and Sealed this

Twentieth Day of September, 2005

JON W. DUDAS
*Director of the United States Patent and Trademark Office*